US011152412B2

(12) United States Patent
Frey et al.

(10) Patent No.: US 11,152,412 B2
(45) Date of Patent: Oct. 19, 2021

(54) IMAGE SENSOR

(71) Applicant: Commissariat à l'Énergie Atomique et aux Énergies Alternatives, Paris (FR)

(72) Inventors: Laurent Frey, Fontaine (FR); Yvon Cazaux, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 130 days.

(21) Appl. No.: 16/719,558

(22) Filed: Dec. 18, 2019

(65) Prior Publication Data
US 2020/0203401 A1 Jun. 25, 2020

(30) Foreign Application Priority Data

Dec. 20, 2018 (FR) ...................................... 1873581

(51) Int. Cl.
*H01L 27/146* (2006.01)

(52) U.S. Cl.
CPC .... *H01L 27/1462* (2013.01); *H01L 27/14636* (2013.01); *H01L 27/14621* (2013.01)

(58) Field of Classification Search
CPC ................. H01L 25/167; H01L 31/107; H01L 27/14643–14663; H01L 27/1462; H01L 27/14636; H01L 27/14621; H01L 27/14627; H01L 27/1463; H01L 27/14605; H01L 27/14603; H01L 27/14625; H01L 27/14632
See application file for complete search history.

(56) References Cited

U.S. PATENT DOCUMENTS

| 2012/0085944 | A1 | 4/2012 | Gidon et al. |
| 2012/0241618 | A1 | 9/2012 | Hsu et al. |
| 2013/0193311 | A1* | 8/2013 | Yoshida ............. H04N 9/04559 250/208.1 |
| 2014/0015932 | A1* | 1/2014 | Kim .................. H01L 27/14621 348/46 |
| 2017/0034456 | A1 | 2/2017 | Kyung et al. |
| 2018/0084238 | A1* | 3/2018 | Chossat ............. H01L 27/1469 |
| 2018/0114805 | A1 | 4/2018 | Takiguchi et al. |
| 2019/0067354 | A1* | 2/2019 | Cheng ............... H01L 27/14629 |

FOREIGN PATENT DOCUMENTS

EP    3 376 267 A1    9/2018

OTHER PUBLICATIONS

Preliminary Search Report for French Application No. 1873581, dated Sep. 13, 2019.

* cited by examiner

*Primary Examiner* — Jonathan Han
(74) *Attorney, Agent, or Firm* — Wolf, Greenfield & Sacks, P.C.

(57) ABSTRACT

An image sensor including a plurality of pixels, each including: a semiconductor photodetection region; a metal region arranged on a first surface of the semiconductor region; a band-pass or band elimination interference filter arranged on a second surface of the semiconductor region opposite to the first surface; and between the semiconductor region and the metal region, a portion of the absorbing layer made of a material different from that of the semiconductor region, the absorbing layer being capable of absorbing, in a single passage, more than 30% of an incident radiation at the central wavelength of the pass band or of the stop band of the interference filter.

11 Claims, 11 Drawing Sheets

IMAGE SENSOR

This application claims the priority benefit of French patent application number 18/73581, filed on Dec. 20, 2018, the content of which is hereby incorporated by reference in its entirety to the maximum extent allowable by law.

TECHNICAL BACKGROUND

The present disclosure generally concerns electronic devices and more particularly aims at an image sensor.

PRIOR ART

Conventionally, an image sensor enables to obtain images of a scene in the visible and/or infrared range.

For example, the sensor captures the visible radiations originating from a scene to obtain a visible image. The image corresponds to radiations captured in one or a plurality of wavebands, for example, in three wavebands respectively corresponding to the blue, green, and red colors.

Certain image sensors use infrared radiations to obtain a three-dimensional image of the scene. For example, the sensor is associated with an infrared pulse emitter. The travel time of the pulses from the emitter to the scene, and then from the scene to the sensor, delivers depth information. The three-dimensional image is obtained from the depth information. Such a sensor is called time of flight sensor TOF. Such a sensor captures the radiations in a waveband corresponding to the wavelengths of the pulses emitted by the emitter. This waveband is typically located in near infrared, that is, infrareds having wavelengths smaller than 1,100 nm. The sensor may only deliver the depth map of the scene, or the three-dimensional image formed of the depth map combined with the visible image.

An image sensor comprises a plurality of pixels generally arranged in an array. The radiations of each waveband of interest of the sensor are specifically captured by pixels, distributed in the array, mainly sensitive to the radiations in this waveband.

In practice, when a pixel is designed to be sensitive to the radiations in a waveband, this pixel is also sensitive to radiations located outside of the waveband. The radiations located outside of the targeted waveband form parasitic radiations having their detection by the pixel decreasing the quality of the image. It is thus desirable for pixels designed to be sensitive to radiations in one of the wavebands to be as little sensitive as possible to the radiations located outside of this band.

SUMMARY

An embodiment provides an image sensor comprising a plurality of pixels, each comprising: a semiconductor photodetection region; a metal region arranged on a first surface of the semiconductor region; a band-pass or band elimination interference filter arranged on a second surface of the semiconductor region opposite to the first surface; and between the semiconductor region and the metal region, a portion of the absorbing layer made of a material different from that of the semiconductor region, the absorbing layer being capable of absorbing, in a single passage, more than 30% of an incident radiation at the central wavelength of the pass band or of the stop band of the interference filter.

According to an embodiment, in each pixel, the semiconductor layer is made of silicon.

According to an embodiment, in each pixel, the absorbing layer comprises germanium or carbon.

According to an embodiment, in each pixel, said absorbing layer portion is doped.

According to an embodiment, in each pixel, the absorbing layer is amorphous.

According to an embodiment, in each pixel, the absorbing layer is conductive and coupled to a node of application of a bias potential.

According to an embodiment, the absorbing layer portion has a network pattern of absorbing elements and/or of openings.

According to an embodiment, each pixel comprises a portion of a dielectric layer located against the absorbing layer on the side of the semiconductor region.

According to an embodiment, in each pixel, the interference filter comprises a repetition of alternated layers having different optical indexes.

According to an embodiment, in each pixel, the central wavelength is in the wavelength range from 700 nm to 1,100 nm.

According to an embodiment, each pixel comprises an additional colored or infrared filter covering the first surface of the semiconductor region.

The foregoing and other features and advantages will be discussed in detail in the following non-limiting description of specific embodiments in connection with the accompanying drawings.

DESCRIPTION OF THE EMBODIMENTS

Figure 1:
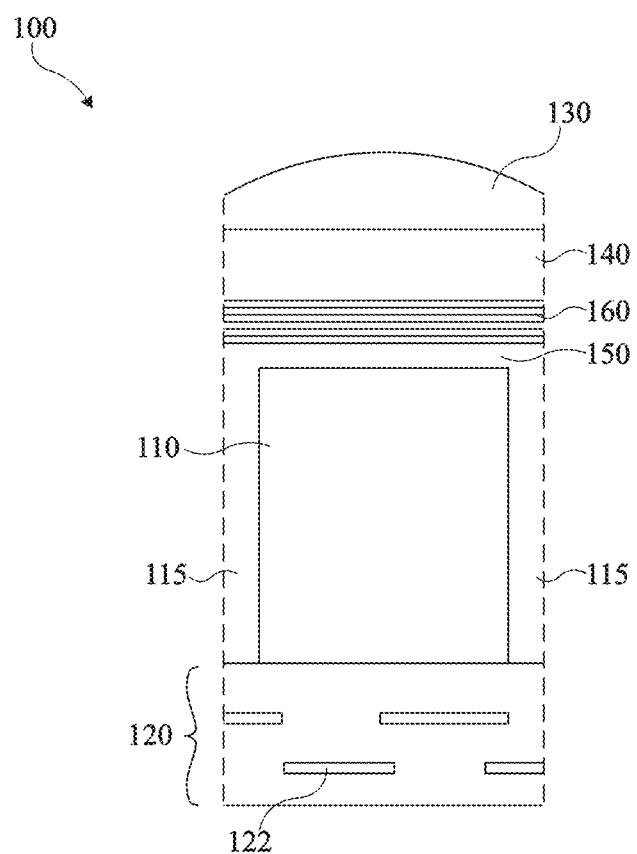
FIG. 1 is a cross-section view schematically showing an example of an image sensor pixel.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, elements of the image sensor such as circuits comprising transistors allowing the operation of pixels are not detailed, the described embodiments being compatible with usual circuits allowing the operation of the pixels of an image sensor. Further, the selection of thicknesses of layers of antireflection stacks for a given wavelength, and of band-pass or band elimination filters in given wavebands, are not described in detail, the described stacks and filters being compatible with usual methods enabling to select the thicknesses of the layers of antireflection stacks and of interference filters.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

Unless otherwise specified, the term optical index designates the real part of the complex optical index.

FIG. 1 is a cross-section view schematically showing an example of a pixel 100 of an image sensor. The pixel is for example located in an array of pixels and has its lateral edges in contact with neighboring pixels.

In the orientation of the drawing, the sensor is intended to receive an optical radiation arriving from the top of the pixels. The term optical radiation here designates a visible radiation or a radiation located in near infrared. The optical radiation typically originates from an element of a scene facing the pixel.

Pixel 100 comprises a semiconductor photodetection region 110, typically made of silicon. Semiconductor region 110 may be delimited by insulating trenches 115 filled with an electric insulator, for example, silicon oxide. As a variation, the trenches comprise conductors insulated from region 110. Trenches 115 separate the various semiconductor regions 110 from the neighboring pixels of the image sensor.

As an example, the pixel extends laterally across a width in the range from 2 to 5 micrometers, for example, in the order of 3 micrometers. Region 110 typically has a thickness, corresponding to the height in the orientation of the drawing, in the range from 2 to 10 micrometers, for example, in the order of 3 micrometers.

Semiconductor region 110 has its lower surface, or front surface, covered with an insulating layer 120. Metal regions 122 are located in layer 120. Regions 122 are typically conductive elements such as conductive tracks and/or conductors filling vias. The conductive elements connect to one another components, not shown, such as transistors, which allow the operation of the pixel and/or of various portions of the image sensor.

In the shown example, the pixel comprises a lens 130 on the side on which the optical radiations arrive. Lens 130 enables to focus the optical radiations towards photodetection region 110.

Further, pixel 100 may comprise a filter 140 covering the surface of photodetection region 110 located on the side on which the optical radiations arrive. Filter 140 is preferably located between lens 130 and photodetection region 110. Filter 140 is used to select the wavelengths of the radiations detected by the pixel. Preferably, filter 140 is an organic filter, for example, made of resin. Filter 140 may form an infrared filter, that is, giving way to optical radiations in infrared wavelengths, preferably in near infrared. Filter 140 may form a colored filter, that is, giving way to optical radiations in a waveband in the visible range, preferably corresponding to color red, green, or blue.

The pixel may further comprise an antireflection layer 150. Layer 150 may comprise one or a plurality of dielectric layers. Antireflection layer 150 is provided to limit the upward reflection of optical radiations at the wavelengths detected by the pixel.

Pixel 100 further comprises an interference filter 160. An interference filter is a stack of a plurality of layers having alternated optical indexes. As an example, the interference filter comprises, preferably is formed by, an alternation of first and second layers, the first layers being identical to one another and the second layers being identical to one another. Preferably, the interference filter comprises at least two, for example, at least three, first layers and at least two, for example, at least three, second layers. As an example, the first layers are dielectric, and the second layers are dielectric and/or are metal layers sufficiently thin to be at least partially transparent. The interference filter is preferably formed by silicon oxide layers, having silicon or titanium oxide or silicon nitride layers interposed therebetween. The thickness of the interference filter is preferably smaller than the width of region 110, for example, smaller than 2.0 micrometers. Interference filter 160 may be a band elimination or band-pass filter, that is, respectively block or give way to radiations in a waveband.

Figure 2:
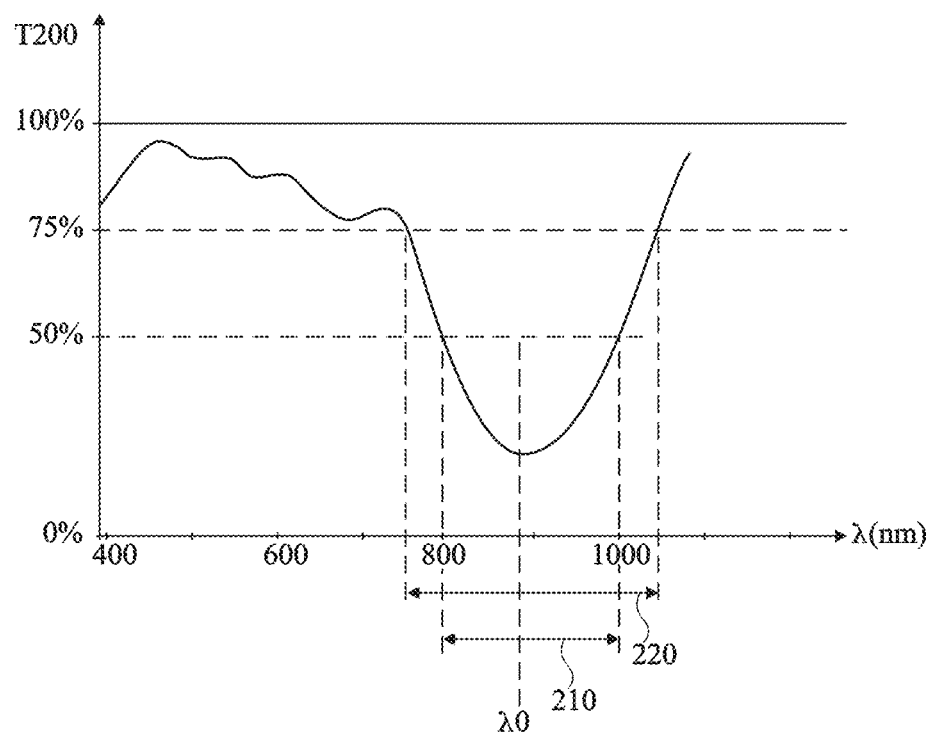
FIG. 2 is a diagram schematically illustrating an example of the variation, according to the wavelength, of the transmission of a filter of the pixel of FIG. 1.

FIG. 2 is a diagram schematically illustrating, as an example, the variation according to wavelength $\lambda$ (in abscissas, in nm) of transmission T200 (in ordinates, between 0% and 100%) of the interference filter 160 of the pixel of FIG. 1, in the case where filter 160 is a band elimination filter. The transmission is defined, for a radiation reaching the upper surface of filter 160 and substantially orthogonal to the mean plane of the layers of filter 160, as being equal to the percentage of this radiation which comes out of the lower surface of the filter.

The band elimination interference filter is designed to block radiations in near infrared, around a central wavelength $\lambda 0$ for example in the range from 700 to 1,100 nanometers (in the order of 875 nm in the shown example). Central wavelength λ0 for example corresponds to a transmission minimum. Preferably, filter 160 gives way to less than 30% of the radiation at wavelength W. Preferably, the interference filter is designed so that the transmission is low, for example, lower than 50%, in a wavelength range 210, and high, for example, higher than 75%, outside of a wavelength range 220 including range 210. Range 210 defines the stop band of the filter. As an example, range 210 has a width greater than 150 nm and is entirely between 700 and 1,100 nanometers, and range 220 has a width greater than 250 nm. The difference between the widths of ranges 220 and 210 is for example in the range from 100 to 200 nm.

In the present example, interference filter 160 comprises seven alternated layers of silicon oxide and of silicon nitride. The total thickness of the filter is in the order of 1.0 micrometer.

Such a band elimination interference filter is preferably used in near infrared when the pixel is provided to detect visible light. Optional filter 140 then is a colored filter. Although filter 140 is designed to only give way to radiations of a waveband in the visible range, in practice, when filter 140 is for example made of resin, filter 140 also gives way to radiations in near infrared. Interference filter 160 then aims at limiting the detection of radiations in near infrared.

The inventors have observed that in fact, despite the presence of interference filter 160, radiations in the waveband partially cut by interference filter 160 remain detected by detection region 110. Thereby, in the image sensor, the detection of near infrared radiations adds to the detection of visible radiations corresponding to the image, which decreases the quality of the image.

Figure 3:
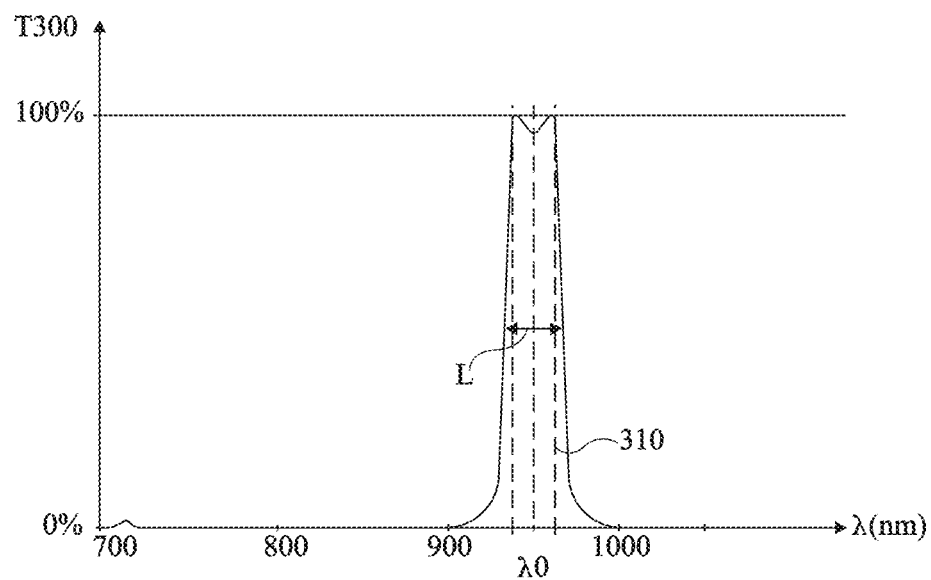
FIG. 3 is a diagram schematically illustrating another example of the variation, according to the wavelength, of the transmission of a filter of the pixel of FIG. 1.

FIG. 3 is a diagram schematically illustrating, as an example, the variation according to wavelength λ, (in abscissas, in nm) of transmission T300 (in ordinates, between 0% and 100%) of the interference filter 160 of the pixel of FIG. 1, in the case where filter 160 is a band-pass filter.

The band-pass interference filter is designed to give way to radiations in a waveband around a central wavelength λ. The central wavelength is preferably located in near infrared, for example, in the range from 700 to 1,100 nm (in the order of 950 nm in the shown example). The transmission preferably has the shape of a peak around the central wavelength. The transmission is for example close to 100% for central wavelength λ0 and decreases on either side of wavelength λ. The full width at half maximum L of the peak is typically in the order of 35 nm. The peak may have a plurality of apexes (two apexes in the shown example) and the half maximum is defined by half the height of the highest apex. The transmission band, or passband, of the filter is defined by the wavelengths for which the transmission is greater than the mid-height of the peak. Central wavelength λ0 then corresponds to the center of the passband. The transmission is close to zero, for example, smaller than 1%, more than 50 nm away from central wavelength W.

Filter 160 comprises in the present example eighteen alternated layers of silicon oxide and silicon nitride. The total thickness of the filter is for example in the order of 1.5 micrometer.

Such a band-pass filter is for example used when the sensor is of time-of-flight type, associated with an infrared pulse emitter. The filter is then designed so that the wavelengths of the pulses are located in the passband of the filter. For example, the wavelength of the pulses is located in a band 310 centered on wavelength W. As an example, band 310 has a width in the order of 25 nm. Preferably, filter 140 then only gives way to infrared radiations, which enables to cut off possible secondary peaks that filter 160 might exhibit outside of the infrared radiation range. As a variation, filter 140 may be omitted.

The inventors have observed that in practice, photodetection region 110 detects radiations in a waveband wider than the desired transmission peak. Thereby, the pixel detects, in addition to the pulses, infrared radiations located outside of band 310. The infrared radiations form parasitic radiations which adversely affect the quality of the obtained depth map.

The embodiments described hereafter enable to improve the quality of images obtained from visible radiations, and/or the quality of depth images.

Figure 4:
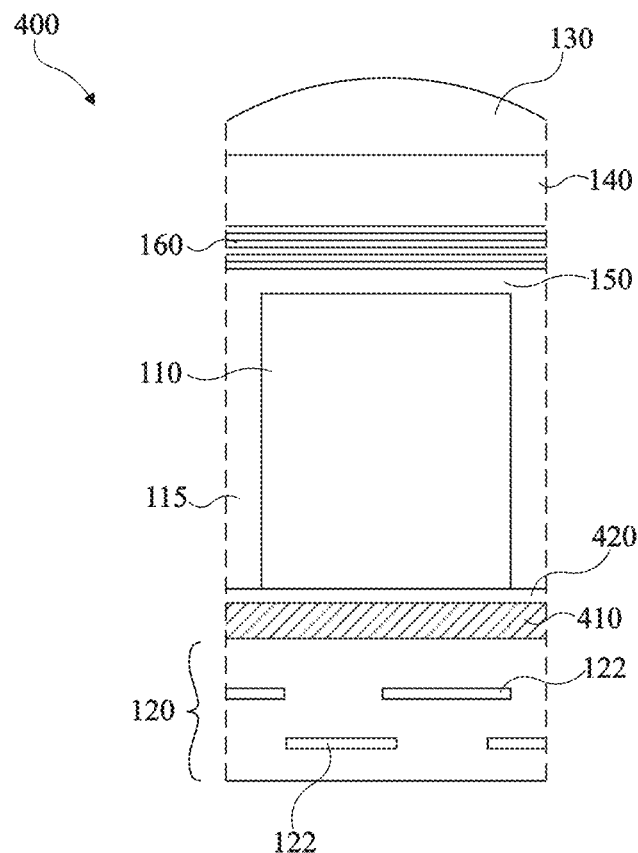
FIG. 4 is a cross-section view schematically showing an embodiment of an image sensor pixel.

FIG. 4 is a cross-section view schematically showing an embodiment of an image sensor pixel 400.

Pixel 400 comprises elements identical or similar to those of pixel 100 of FIG. 1, arranged identically or similarly, that is:
- a semiconductor photodetection region 110, for example, delimited by insulating trenches 115;
- one or a plurality of metal regions 122;
- an interference filter 160; and
- preferably, a lens 130 and/or a filter 140, and/or an antireflection layer 150.

These elements will not be described again in detail hereafter.

Pixel 400 comprises, between metal region(s) 122 and photodetection region 110, a portion of an absorbing layer 410. Preferably, the pixel comprises no metal elements between photodetection region 110 and absorbing layer 410.

Layer 410 is made of a material different from that of semiconductor region 110. The material of layer 410 has, for central wavelength λ0 of interference filter 160, an absorption coefficient greater than that of the semiconductor material of region 110. Layer 410 is selected so that, for the central wavelength λ0 of interference filter 160 and for an incident radiation substantially orthogonal to the mean plane of layer 410, more than 30%, preferably more than 50%, of the radiation entering layer 410 is absorbed into layer 410 in a single passage. In other words, more than 30%, preferably more than 50%, of a radiation entering through a surface of layer 410 is absorbed into layer 410 and does not reach the other surface of layer 410. For example, for wavelength λ0, approximately 55% of the radiation entering layer 410 is absorbed into layer 410 in a single passage. For example, more than 30%, preferably more than half, of any radiation in the wavelength range between 700 nm and 1,000 nm is absorbed in a single passage into layer 410. Preferably, more than 30%, preferably more than half, of any radiation in the stop band or in the pass band of filter 160 is absorbed in a single passage into layer 410.

The proportion A absorbed in a single passage of the intensity of a radiation entering into layer 410 may be determined by expression $A=1-\exp(-a(\lambda)*d)$, where $a(\lambda)$ is the fraction of radiation of wavelength λ absorbed per thickness unit of layer 410, exp is the exponential function, and d is the thickness of absorbing layer 410. Preferably, thickness d is smaller than 500 nm, for example, in the range from 100 nm to 200 nm. Value $a(\lambda)$ may be determined by expression $a(\lambda)=4\pi*k(\lambda)/\lambda$, where $k(\lambda)$ is the extinction coefficient of the material of layer 410 at wavelength k, that is, the imaginary part of the complex optical index of the material of layer 410.

Preferably, the material of layer 410 has, for wavelength λ0, an extinction coefficient $k(\lambda 0)$ greater than 0.3, for example, greater than 0.5. Extinction coefficient $k(\lambda)$ of the material is preferably greater than 0.3, for example, greater than 0.5, for any wavelength λ, in the wavelength range from 700 nm to 1,000 nm. For this purpose, layer 410 is preferably made of germanium or of carbon.

In the case of a germanium layer 410, the germanium is preferably amorphous. The amorphous germanium may result from a deposition by evaporation or by magnetron sputtering at ambient temperature, possibly followed by an anneal at a temperature smaller than 420° C. The germanium, be it amorphous or not, may further be hydrogenated. Preferably, the germanium, crystalline or amorphous, is doped, for example, with boron or phosphorus. The doping level of germanium is then preferably greater than 10^18 atoms/cm^3 (where "^" represents the exponent function).

In the case of a carbon layer 410, the carbon is preferably amorphous. The amorphous carbon may result from a magnetron sputtering, preferably followed by anneal at a temperature greater than approximately 600° C., for example, of 600° C., or for example, of approximately 750° C. The amorphous carbon may also result from a plasma-enhanced chemical vapor deposition (PECVD) at a temperature for example in the range from 500° C. to 600° C.

Preferably, pixel 400 further comprises, between photodetection region 110 and layer 410, an electrically-insulating layer 420, for example, made of silicon oxide or nitride. Layer 420 is for example in contact with photodetection region 110. Layer 420 particularly enables, in the case where layer 410 is conductive, to electrically insulate region 410 from photodetection region 110.

Figure 5:
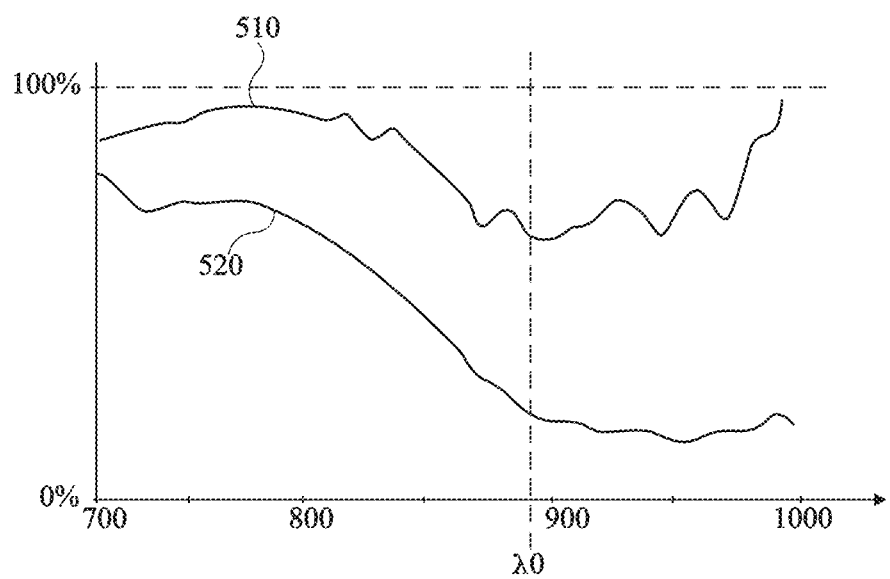
FIG. 5 is a diagram schematically illustrating an example of the variation, according to the wavelength, of detection sensitivities of the pixel of FIG. 1 and of the pixel of FIG. 4.

FIG. 5 is a diagram schematically illustrating, as an example, the variation according to wavelength λ, (in abscissas, in nm) of the detection sensitivities 510 of the pixel of FIGS. 1 and 520 of the pixel of FIG. 4, expressed in percentage between 0 and 100% of the detection sensitivity of a reference pixel, in the case where the interference filter is the band elimination filter of FIG. 2. The reference pixel corresponds to the pixel of FIG. 1 in the absence of interference filter 160.

In the pixel of FIG. 1, the detection sensitivity at central wavelength λ0 of the interference filter remains in the order of 60% of that of the reference pixel, despite the presence of filter 160 provided to give way to less than 30% of the radiation at this wavelength. In the pixel of FIG. 4, the detection sensitivity at the central wavelength λ0 of interference filter 160 is decreased by more than 70% with respect to that of the reference pixel.

Thus, the presence of layer 410 enables to decrease the detection of parasitic radiations in near infrared, and thus to improve the quality of the image.

Figure 6:
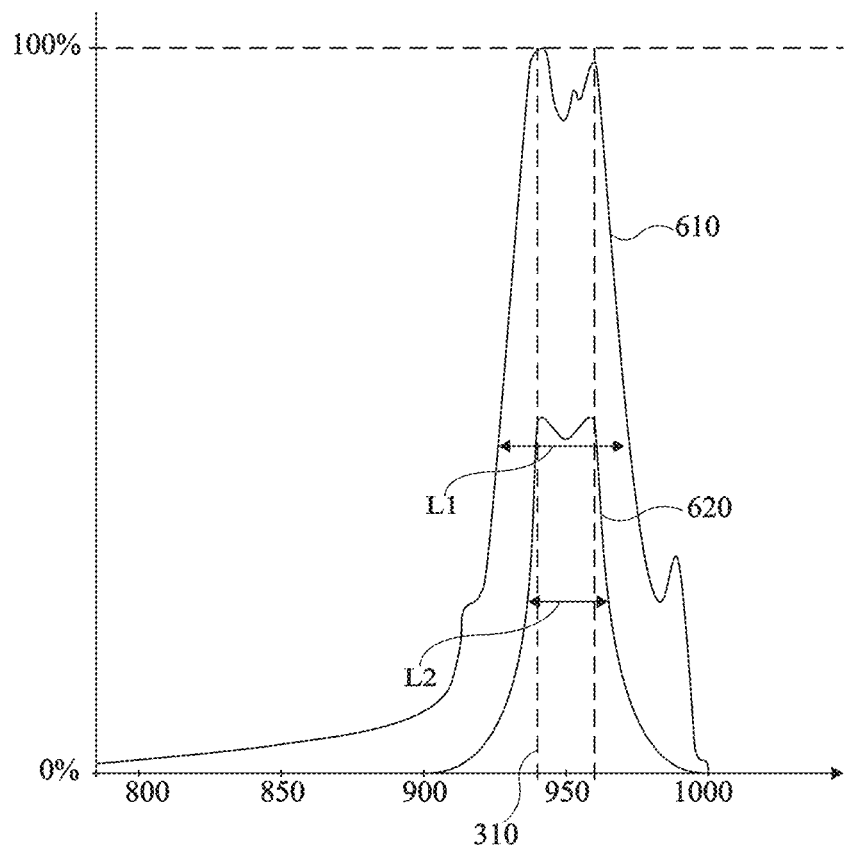
FIG. 6 is a diagram schematically illustrating another example of the variation according to the wavelength of detection sensitivities of the pixel of FIG. 1 and of the pixel of FIG. 4.

FIG. 6 is a diagram schematically illustrating, as an example, the variation according to wavelength λ, (in abscissas, in nm) of the detection sensitivities 610 of the pixel of FIGS. 1 and 620 of the pixel of FIG. 4, expressed in percentage between 0 and 100% of the detection sensitivity of a reference pixel, in the case where the interference filter is the band-pass filter of FIG. 3.

The pixel of FIG. 1 has a sensitivity peak with a full width at half maximum L1 close to 60 nm. Such a full width at half maximum is greater than the full width at half maximum L2 of the transmission peak of filter 160. The full width at half maximum of the detection peak of the pixel of FIG. 4 is smaller than that of the detection peak of the pixel of FIG. 1.

Thus, among the detected infrared radiations, the proportion of infrared radiations located outside of band 310 is smaller in the pixel of FIG. 4 than in the pixel of FIG. 1. The presence of layer 410 thus decreases the proportion of detected parasitic radiations and thus enables to improve the quality of the captured depth image.

Figure 7:
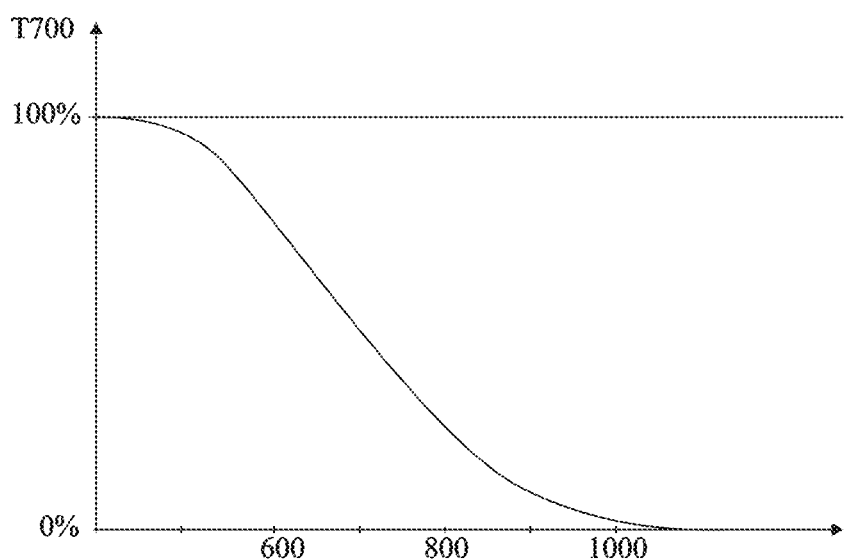
FIG. 7 is a diagram schematically illustrating an example of the variation, according to the wavelength, of the absorption of optical radiations by a semiconductor photodetection region.

An explanation of the function of layer 410 is detailed hereafter in relation with FIG. 7.

FIG. 7 is a diagram schematically illustrating, as an example, the variation according to wavelength λ, (in abscissas, in nm) of absorption T700 of the optical radiations by photodetection region 110, in a single passage through photodetection region 110.

The radiations located in near infrared are partially absorbed and detected by region 110. For example, for the central frequency λ0 of the interference filter, region 110 absorbs and detects in a single passage typically between 1 and 50%, preferably between 2 and 25% of the radiations reaching region 110.

In the absence of layer 410, a radiation reaching region 110 may cross region 110 a first time from top to bottom almost without being absorbed, and then a second time from bottom to top after having been reflected on metal region(s) 122. The radiation then performs a round trip.

For certain wavelengths, interference filter 160 gives way to a portion only, for example, from 1% to 80%, of the radiation. This for example occurs for the entire waveband cut by the band elimination filter of FIG. 2, and in the lateral portions of the transmission peak of the band-pass filter of FIG. 3. The interference filter then reflects the non-transmitted portion of the radiation.

In the absence of absorbing layer 410, for such wavelengths of partial transmission by filter 160, the radiation having crossed filter 160 then performs multiple round trips between, at the bottom, metal regions 122 and, at the top, partially-reflective filter 160. The less the interference filter gives way to radiation, the more reflective it is and the higher the number of round trips. Thus, the decrease by filter 160 of the radiations reaching region 110 goes along with an increase in the number of passages through region 110. Once it has entered region 110, a radiation is all the more detected at the number of round trips is large. Accordingly, the decrease of the radiation entering through filter 106 does not result in a decrease of sample amplitude of the detection sensitivity of the pixel.

In the presence of absorbing layer 410, the number of passages of the radiation through region 110 is limited by layer 410. This decreases the sensitivity of detection of radiations for the wavelengths of partial transmission of filter 160. In the presence of absorbing layer 410, the partial blocking by filter 160 of parasitic radiations then results in a corresponding decrease in the sensitivity of detection of parasitic radiations by the pixel. The quality of the visible and/or infrared image has thus been improved.

Preferably, insulating layer 420, which separates absorbing layer 410 from photodetection region 110 (FIG. 4) is in contact with absorbing layer 410. The material of layer 420 generally has an optical index, or refraction index, smaller than that of absorbing layer 410, for example, the optical indexes of layers 410 and 420 differ by more than 1.5. As an example, layer 420 is made of silicon oxide. Further, layer 120 (FIG. 4, located under absorbing layer 410) is preferably in contact with layer 410. Layer 120 generally comprises, in contact with absorbing layer 410, a material having an optical index smaller than that of absorbing layer 410, for example, the indexes of absorbing layer 410 and of this material differ by more than 1.5. As an example, the insulator of layer 120 is silicon oxide.

The thicknesses of layer 410 and 420 and the positions of metal regions 122 are preferably selected so that absorbing layer 410, insulating layer 420, and layer 120 comprising metal regions 122 altogether form an antireflection stack. Preferably, the antireflection stack reflects less than 50%, for example, less than 20%, of the radiations reaching the antireflection stack on the side of photodetection region 110, for central wavelength W.

The decrease in the proportion of radiations which are reflected towards the photodetection region enables to increase the absorption by layer 410. The quality of the obtained images is thus better than if layers 410, 420 altogether do not form an antireflection assembly.

Preferably, layer 420 comprises, for example, is formed by, a plurality of stacked dielectric layers made of materials having different optical indexes, for example, of silicon oxide and of silicon nitride. The materials and thicknesses of these layers may be selected to decrease the proportion of radiations reflected by the antireflection stack, as compared with a layer 420 made of a single material. Preferably, layer 420 comprises, for example, is formed by, a silicon oxide layer in contact with region 110, and a silicon nitride layer in contact with layer 410. As an example, the silicon oxide layer has a thickness in the range from 10 to 30 nanometers. As an example, the silicon nitride layer has a thickness in the range from 30 to 50 nanometers.

Although a silicon photodetection region, partially detecting radiations in near infrared, has been described herein, the photodetection region may be made of another semiconductor. This other semiconductor may then have a wavelength range where it only partially absorbs and detects radiations. The central wavelength of the interference filter is selected in this range. Preferably, the absorbing layer is selected to absorb in a single passage more than 30%, for example, more than 50%, of any radiation in this wavelength range.

Figure 8:
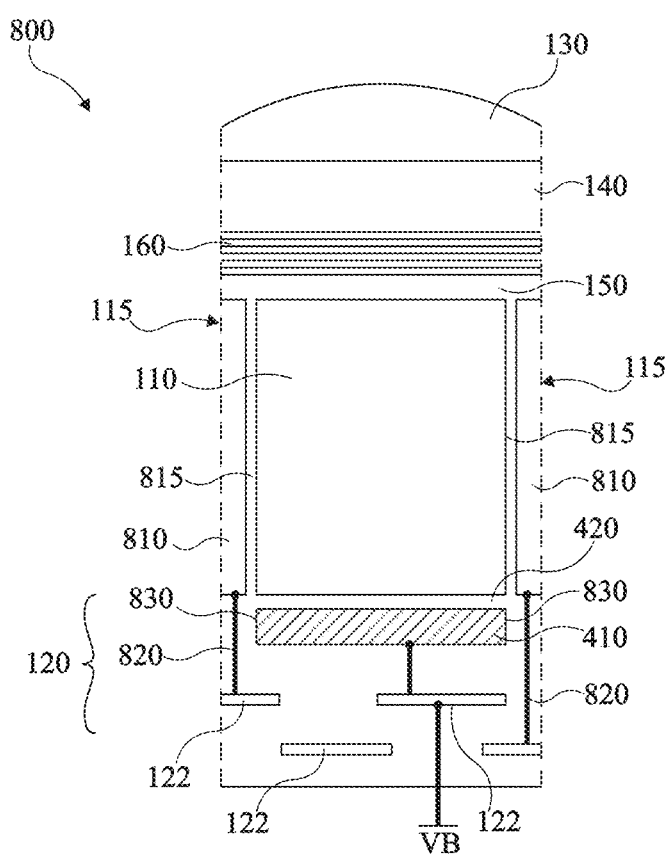
FIG. 8 is a cross-section view schematically showing an alternative embodiment of the pixel of FIG. 4.

FIG. 8 is a cross-section view schematically showing an alternative embodiment 800 of the pixel of FIG. 4.

In this variation, layer 410 is conductive and is coupled, preferably connected, to a node of application of a bias voltage, VB, for example, via one of the metal regions 122 forming an interconnection track. The application of a bias voltage to absorbing layer 410 enables to discharge possible electric charges trapped in layer 420. Further, the application of this bias voltage may enable to avoid storing charges in layer 410, which might disturb the electric potential of region 110.

As an example, insulating trenches 115 each comprise a conductive region 810 insulated from region 110 by insulator 815. Regions 810 are coupled, preferably connected, to some of metal regions 122 by connections 820. A capacitive element enabling to electrostatically influence region 110 and/or to decrease or neutralize the dark current has thus been obtained for each trench. Indeed, the decrease or the neutralization of the dark current may be obtained by accumulation of holes to store electrons, or of electrons to store holes.

Layer 410 has openings 830 at the level of connections 820. Openings 830 enable to electrically insulate connections 820 from absorbing layer 410. Any electric connection crossing layer 410 may be insulated from layer 410 by an opening 830. The electric connections for example form contacts towards elements of the pixel such as transistors or junctions. Openings 830 are preferably located at the level of the pixel edges. However, regions 810, connections 820, and openings 830 may be omitted.

Figure 9:
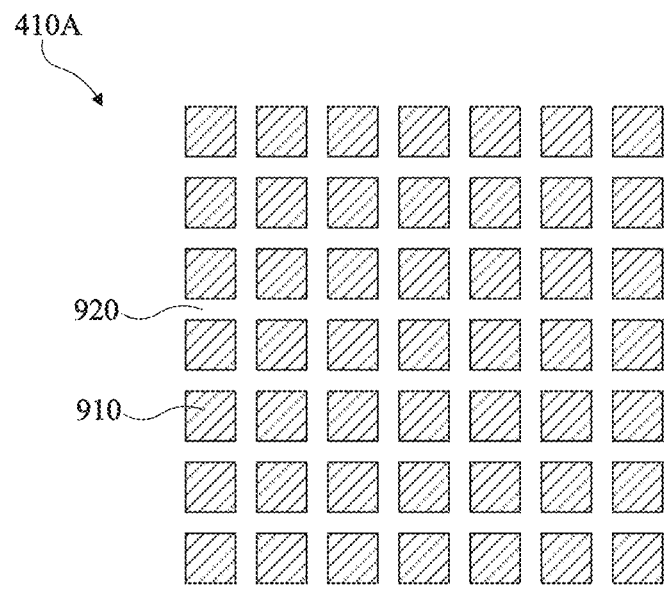
FIG. 9 schematically shows in top view an alternative embodiment of an absorbing layer of the pixel of FIG. 4.

FIG. 9 schematically shows in top view an alternative embodiment 410A of the absorbing layer 410 of the pixel of FIG. 4.

Absorbing layer 410A comprises absorbing elements 910 forming a network pattern. In the shown example, the absorbing elements are layer portions, for example, each in the shape of a slab or of a pad. The absorbing elements each have a shape, for example, square, in top view. The absorbing elements are preferably made of an absorbing material such as those defined hereabove for layer 410 of FIG. 4. Preferably, the pattern formed by elements 910 is a regular network, for example, an array. However, the described embodiments are not limited to regular networks.

Absorbing layer 410A comprises, between the absorbing elements, a dielectric material 920 having an optical index smaller than that of the absorbing elements. Preferably, the difference between the optical index of material 920 and that of absorbing elements 910 is greater than 1.5. As an example, material 920 is silicon oxide.

The pitch of the lines and of the rows of the array, or the pitch of the network pattern, are preferably smaller than half of wavelength λ0, for example smaller than one quarter of wavelength W. It is thus avoided for layer 410A to diffract radiations at this wavelength. Layer 410A then has an average effective optical index between the optical indexes of material 920 and of the material of absorbing elements 910. This average effective optical index may be selected to limit reflections on the upper surface of layer 410. This enables to improve the antireflection function of the stack of layers 420, 410, and 120 with respect to a continuous layer 410. The quality of the obtained images is thus improved.

Preferably, the pads have same dimensions and are arranged with a same pitch, in the line and row directions of the array. This enables to obtain same optical properties for any light polarization.

Figure 10:
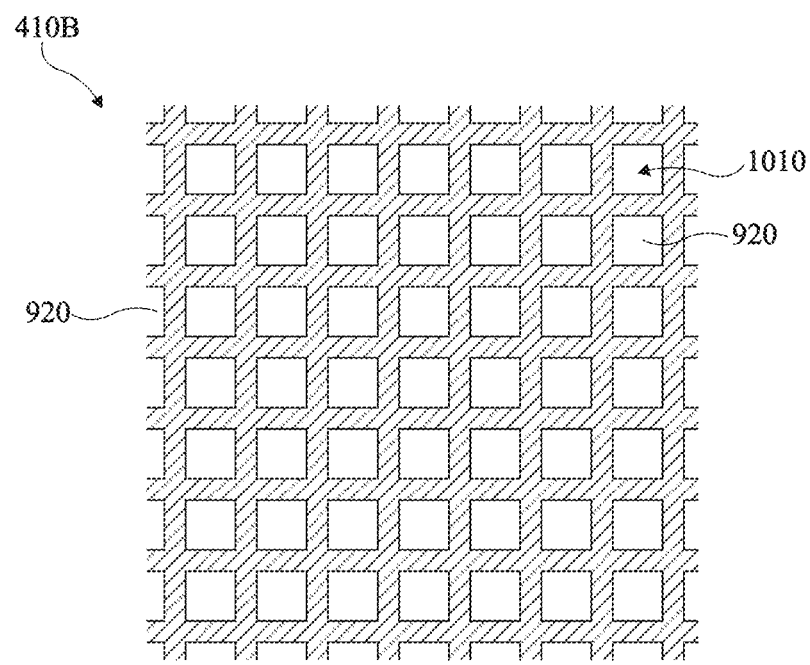
FIG. 10 schematically shows, in top view, another alternative embodiment of an absorbing layer of the pixel of FIG. 4.

FIG. 10 schematically shows another alternative embodiment 410B of layer 410 of the pixel of FIG. 4. Layer 410B corresponds to layer 410A of FIG. 9 where the positions of dielectric material 920 and of the absorbing material have been exchanged. Thus, the absorbing material of layer 410B forms a grid defining openings 1010. Openings 1010 are arranged in a network. Openings 1010 are filled with dielectric material 920.

In the case where absorbing material 920 is conductive, layer 410B may replace layer 410 of the pixel of FIG. 8. Indeed, the grid shape enables the entire absorbing material to be in electric contact with the node of application of bias voltage VB.

Figure 11:
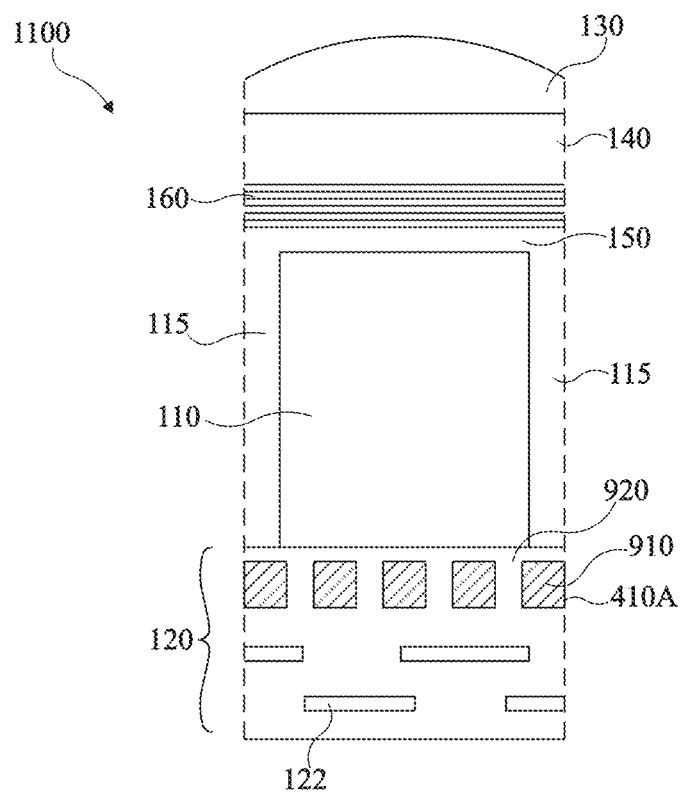
FIG. 11 is a cross-section view schematically showing an embodiment of a pixel comprising the absorbing layer of FIG. 9.

FIG. 11 is a cross-section view schematically showing an embodiment of a pixel 1100 comprising layer 410A of FIG. 9. More particularly, pixel 1100 corresponds to the pixel 400 of FIG. 4 where layer 410 has been replaced with layer 410A of FIG. 9. Pads 910 and material 920 delimiting pads 910 occupy the entire thickness of layer 410A. Material 920 occupies the entire thickness of the absorbing layer. A similar cross-section view is obtained by replacing layer 410A with layer 410B of FIG. 10.

Figure 12:
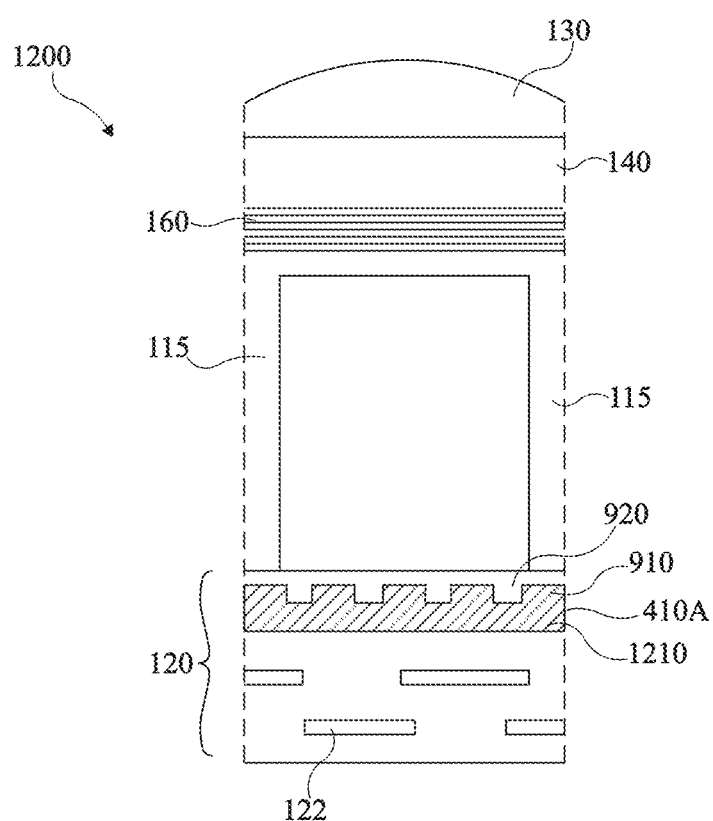
FIG. 12 is a cross-section view schematically showing an alternative embodiment of the pixel of FIG. 11.

FIG. 12 is a cross-section view schematically showing an alternative embodiment 1200 of the pixel of FIG. 11. In this variation, pads 910 made of the absorbing material and dielectric material 920 only extend over an upper portion of layer 410A. The lower portion of layer 410A forms a solid continuous layer extending over the entire surface of layer 410A.

Similarly, in the variation of FIG. 10, the grid made of the absorbing material and the pads made of dielectric material 920 may extend across a portion only of the thickness of layer 410B, the lower portion of layer 410B forming a solid continuous layer made of the absorbing material. The solid layer may extend over the entire surface of layer 410B or, preferably, extend over the entire surface of layer 410B except for openings allowing the passage of connections such as the openings 830 described in relation with FIG. 8.

Figure 13:
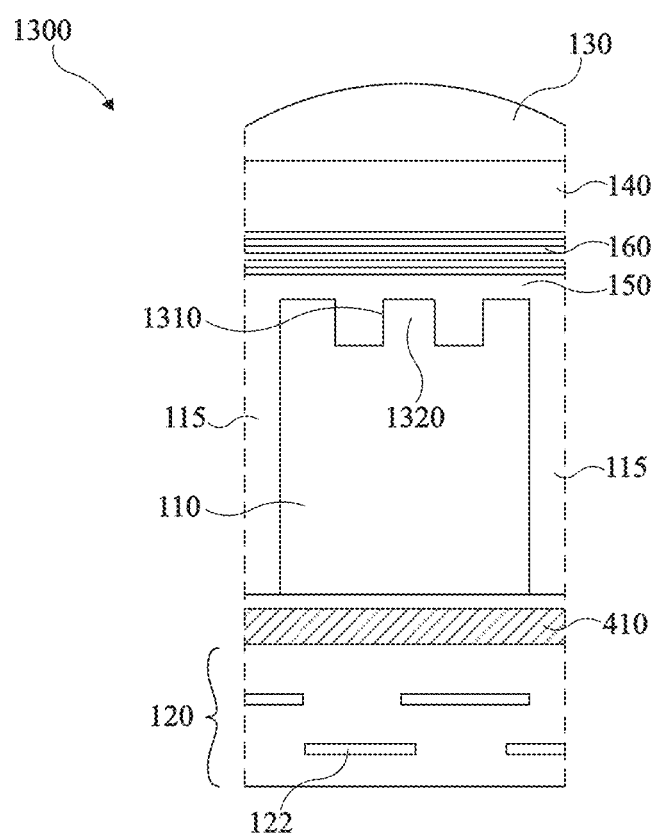
FIG. 13 is a cross-section view showing another alternative embodiment of the pixel of FIG. 4.

FIG. 13 is a cross-section view schematically showing another alternative embodiment 1300 of the pixel of FIG. 4. In this variation, cavities 1310 extend in region 110 from its upper surface. Cavities 1310 are filled with a dielectric material, for example, silicon oxide. Cavities 1310 are preferably arranged in a network. The pitch of the network is for example greater than half a central wavelength of the waveband detected by the pixel. In the case where filter 160 is a band-pass filter, the pitch of the network is preferably greater than half the central wavelength λ0 of filter 160.

Cavities 1310 and portions 1320 of region 110 arranged between its cavities form a diffraction grating. The diffraction grating introduces angles in the propagation of radiations entering from the top of photodetection region 110. This radiation then performs a plurality of round trips with a horizontal component in region 110 between the lateral walls of region 110. The length of the travel of the radiation within region 110, and thus the probability for the radiation to be detected by region 110, are thus increased. Conversely to the round trips between the bottom and the top of the pixel, the number of which depends on the transmission of filter 160, horizontal round trips increase the detection substantially in the same way for all the wavelengths of the band detected by the pixel. Thus, the diffraction grating in the upper portion of region 110 provides pixel 1300 with a sensitivity to radiations greater than that of a pixel which does not comprise such a diffraction grating, while keeping the advantage of the image quality provided by limiting of the number of vertical round trips.

Figure 14:
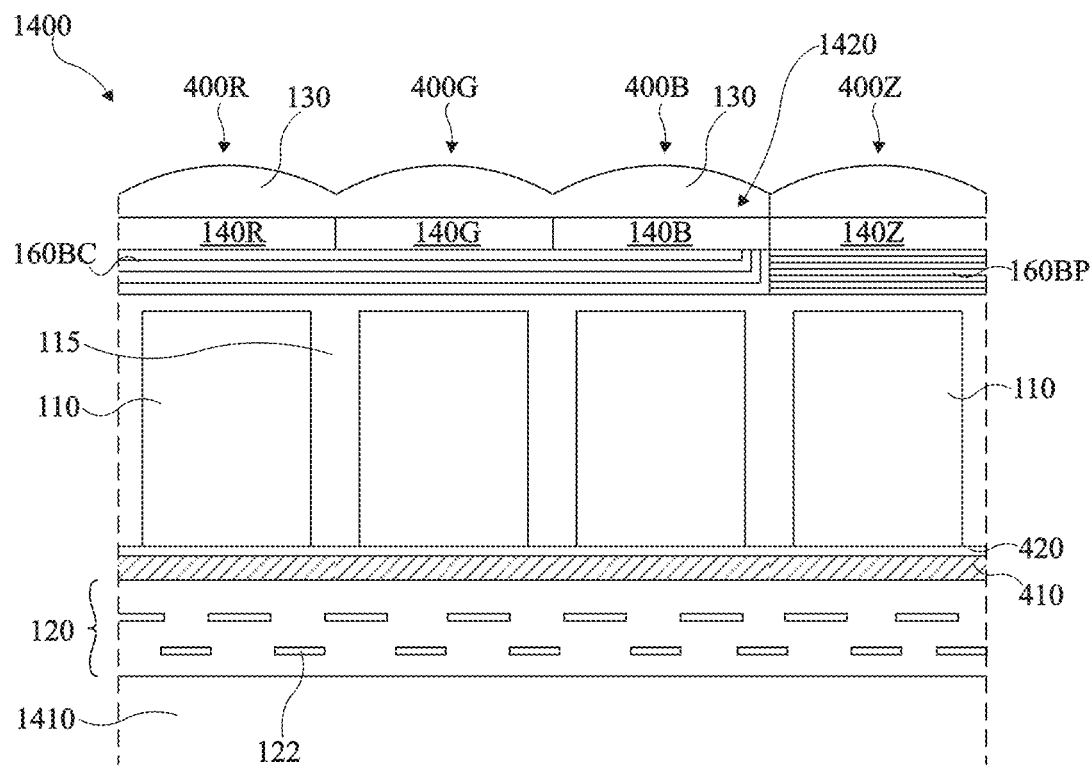
FIG. 14 is a cross-section view partially and schematically showing an embodiment of an image sensor.

FIG. 14 is a cross-section view partially and schematically showing an embodiment of an image sensor 1400 comprising pixels of the type of pixel 400 of FIG. 4. Sensor 1400 may capture three-dimensional color images or color and infrared images.

More particularly, a group of four pixels 400R, 400G, 400B, and 400Z, of sensor 1400 has been shown. Pixels 400R, 400G, 400B, and 400Z, each correspond to the pixel 400 of FIG. 4 where filter 140 is formed by a filter respectively 140R, 140G, 140B, and 140Z, respectively giving way to blue light, green light, red light, and near infrared radiations. Filter 140Z is optional.

In each of pixels 400R, 400G, and 400B, the interference filter 160 of the pixel 400 of FIG. 4 is formed by a band elimination interference filter 160BC, of the type of the filter of FIG. 2. Preferably, filter 160BC is a same continuous filter common to pixels 400R, 400G, and 400B. In pixel 400Z, the interference filter 160 of pixel 400 of FIG. 4 is formed by a band-pass interference filter 160BP, for example, of the type of the filter of FIG. 3.

Preferably, absorbing layer 410, the possible insulating layer 420, and layer 120 are common for the various sensor pixels, and in particular common to the four pixels of the group of shown pixels.

As mentioned hereabove, absorbing layer 410 limits the number of round trips of light between the top and the bottom of each of the pixels, thus improving the quality of the captured image.

Further, absorbing layer 410 limits the quantity of optical radiation, particularly infrared, which, after having crossed from top to bottom the region 110 of one of the pixels, is reflected by metal regions 122 towards the neighboring pixels. This corresponds to an additional improvement of the image quality.

To form pixels 400R, 400G, 400B, and 400Z, preferably, regions 110 and the trenches 115 separating regions 110 are previously formed in a semiconductor substrate. The possible insulating layer 420, absorbing layer 410, and the insulating layers 120 containing metal regions 122 are then formed on the front side of the substrate (lower surface). Preferably, a handle 1410, for example, a semiconductor wafer, is then bonded on the front surface of insulating layers 120. All the elements are then removed from the back side of the substrate down to a level defining the upper level of regions 110, for example, by polishing.

Then, in a first step, filters 160BP are formed. For this purpose, for example, all the upper surfaces of regions 110 are covered with a first stack of alternated layers forming filter 160BP, after which the portions of the first stack of layers located at the locations of pixels 400R, 400G, and 400B are then removed, for example, by etching.

In a second step, filters 160BC are formed. To achieve this, for example, the structure obtained at the first step is covered with a second stack of layers corresponding to filters 160BC. The portions of the second stack located at the location of pixel 400Z are then removed, for example, by chem.-mech. polishing.

Filters 140R, 140G, and 140B, and optional filter 140Z, and then optional lenses 130, are then formed.

The parasitic radiations that the filter partially lets through are all the more numerous as the filter is thin. Due to the fact that absorbing layer 410A decreases the detection of such parasitic radiations, the thickness of the filter with respect to a sensor comprising no layer 410A may be decreased for a given quantity of absorbed parasitic radiations, that is, for a given image quality. Lenses 130 can then be brought closer to regions 110, which enables to increase the viewing angle of the sensor, and this, without altering the image quality. Further, such a thickness decrease has a corresponding decrease in the width, or horizontal dimension, of a region 1420 where the second stack, which corresponds to filters 160BC, has its layers laterally stacked against the side of filter 160BP. In region 1420, filter 160BC has degraded filtering properties. The fact of reducing this region enables to decrease the size of the pixels without altering the image quality as compared with a sensor comprising no absorbing layer 410.

Figure 15:
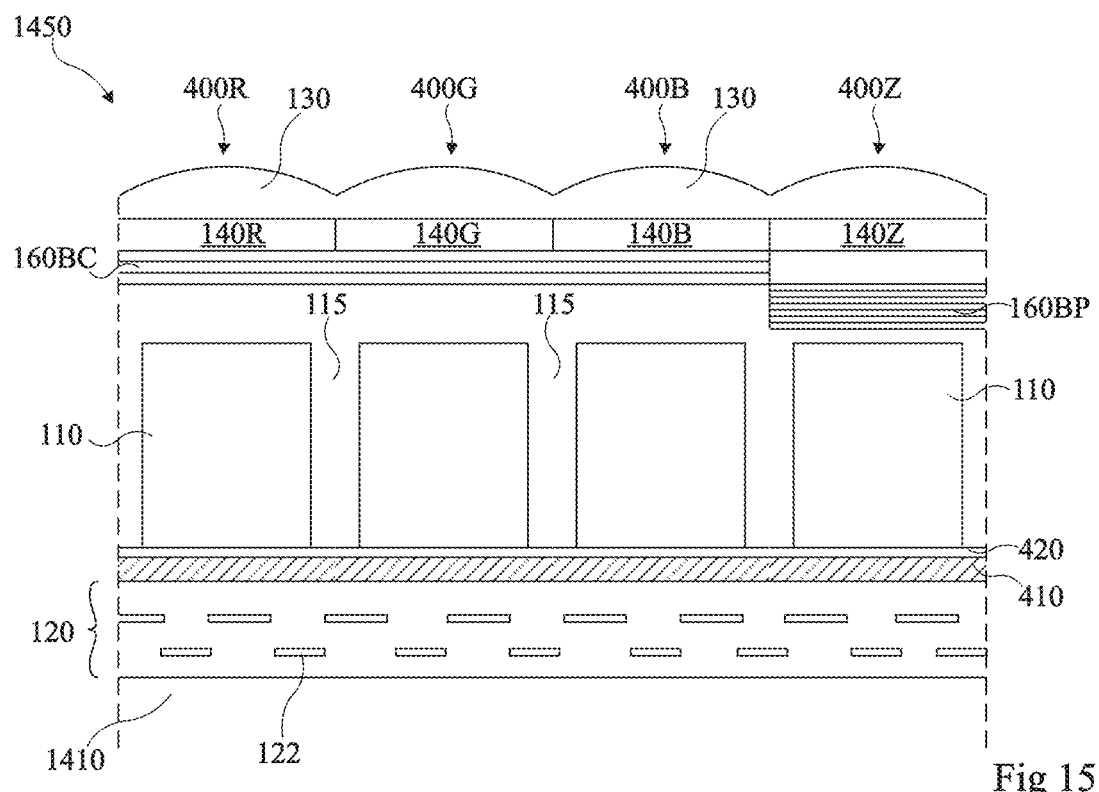
FIG. 15 is a cross-section view partially and schematically showing an embodiment of an image sensor pixel.

FIG. 15 is a cross-section view partially and schematically showing an embodiment of an image sensor 1450 comprising pixels of the type of the pixel 400 of FIG. 4. Sensor 1450 shows the elements of sensor 1400 of FIG. 14, with the difference that the manufacturing of filters 160BC and 160BP comprises an additional step between the first and second steps.

At this additional step, a dielectric layer, for example, made of silicon oxide, is formed at the locations of pixels 400R, 400G, and 400B up to the upper level of filter 160BP formed at the first step. To achieve this, the structure obtained at the first step is covered with the oxide layer after which, all the elements located above the upper surface of filter 160BP are removed, for example, by chem.-mech. polishing.

Then, at the second step, the second stack, which corresponds to filter 160BC, is deposited over the planar surface left by the polishing, and the portions of the second stack are removed from the location of pixel 400Z by etching.

Advantageously, due to the fact that filters 160BC are formed on a planar surface and are delimited by etching, they form a stack of planar layers of constant thicknesses over the entire surface of the filter. The filtering quality is thus better than with a filter formed of non-planar layers and/or of non-constant thicknesses.

At a subsequent step, a dielectric layer portion, for example, made of silicon oxide, may be formed at the location of pixel 400Z, up to the upper level of filter 160BC. To achieve this, for example, the structure obtained at the second step is covered with a dielectric layer, for example, made of silicon oxide, after which all the elements located above the upper surface of filter 160BC is removed, for example, by chem.-mech. polishing.

Figure 16:
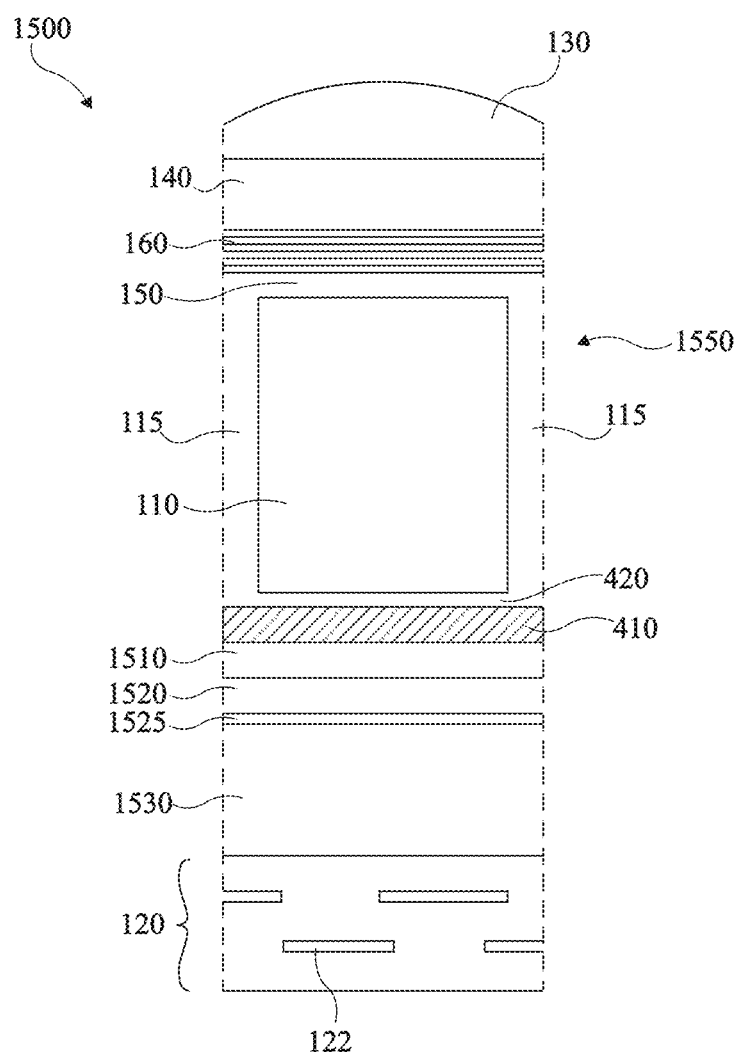
FIG. 16 is a cross-section view schematically showing an embodiment of an image sensor pixel.

FIG. 16 is a partial simplified cross-section view showing an embodiment of an image sensor pixel 1500. Pixel 1500 comprises elements identical or similar to those of pixel 400 of FIG. 4. Pixel 1500 differs from that of FIG. 4 in that it comprises, between absorbing layer 410 and insulating layer 120, successively from absorbing layer 410, a dielectric layer 1510, a conductive layer 1520, an insulating layer 1525, and a semiconductor region 1530, for example, made of silicon. Conductive region 1520 and insulating layer 1525 may be omitted.

To form pixel 1500, region 110 and trenches 115 are formed in a semiconductor substrate. The front side of the substrate (lower surface) is then covered with the possible insulating layer 420 and then by absorbing layer 410. Absorbing layer 410 is covered with dielectric layer 1510, for example, made of silicon oxide.

After dielectric layer 1510, conductive region 1520 is formed. For example, region 1520 defines a ground plane and covers the entire lower surface (or front side) of the semiconductor substrate. Insulating region 1525, for example, made of silicon oxide, is then formed. After this, semiconductor region 1530 is bonded to layer 1525 by molecular bonding. Components of electronic circuits of the image sensor are then formed, for example, transistors (not shown) inside and on top of semiconductor region 1530, on its lower surface side (front side). Then, insulating layers and metal regions 122 are formed. Regions 122 preferably correspond to interconnection tracks between components of the image sensor circuits.

Layer 150, interference filter 160, optional filter 140, and optional lens 130, are for example formed at a subsequent step of the pixel manufacturing.

An advantage of pixel 1500 is that part of the image sensor circuits are formed inside and on top of region 1530 independently from photodetection regions 110, which enables to decrease the pixel size or to integrate additional functions, as compared with an image sensor which does not comprise semiconductor region 1530. Further, the presence of region 1520 may enable to optimize the operation of the image sensor circuits.

The presence of layer 1510 and of region 1520 in pixel 1500 has the same effect on the reflection of light as layer 120 and regions 122 in pixel 400 of FIG. 4. In pixel 1500, layer 410 limits the number of possible round trips of the radiations in cavity 110 after reflection, on region 1520 and on filter 160. An improved image quality is obtained, in a sensor comprising pixels of the type of pixel 1500, in the same way as in an image sensor comprising pixels of the type of pixel 400 of FIG. 4.

Layers 420, 410, and 1510 are preferably selected so that the stack of layers 420, 410, and 1510 has an antireflection effect, identically to that described in relation with FIG. 4 for the stack of layers 420, 410, and 120.

Figure 17:
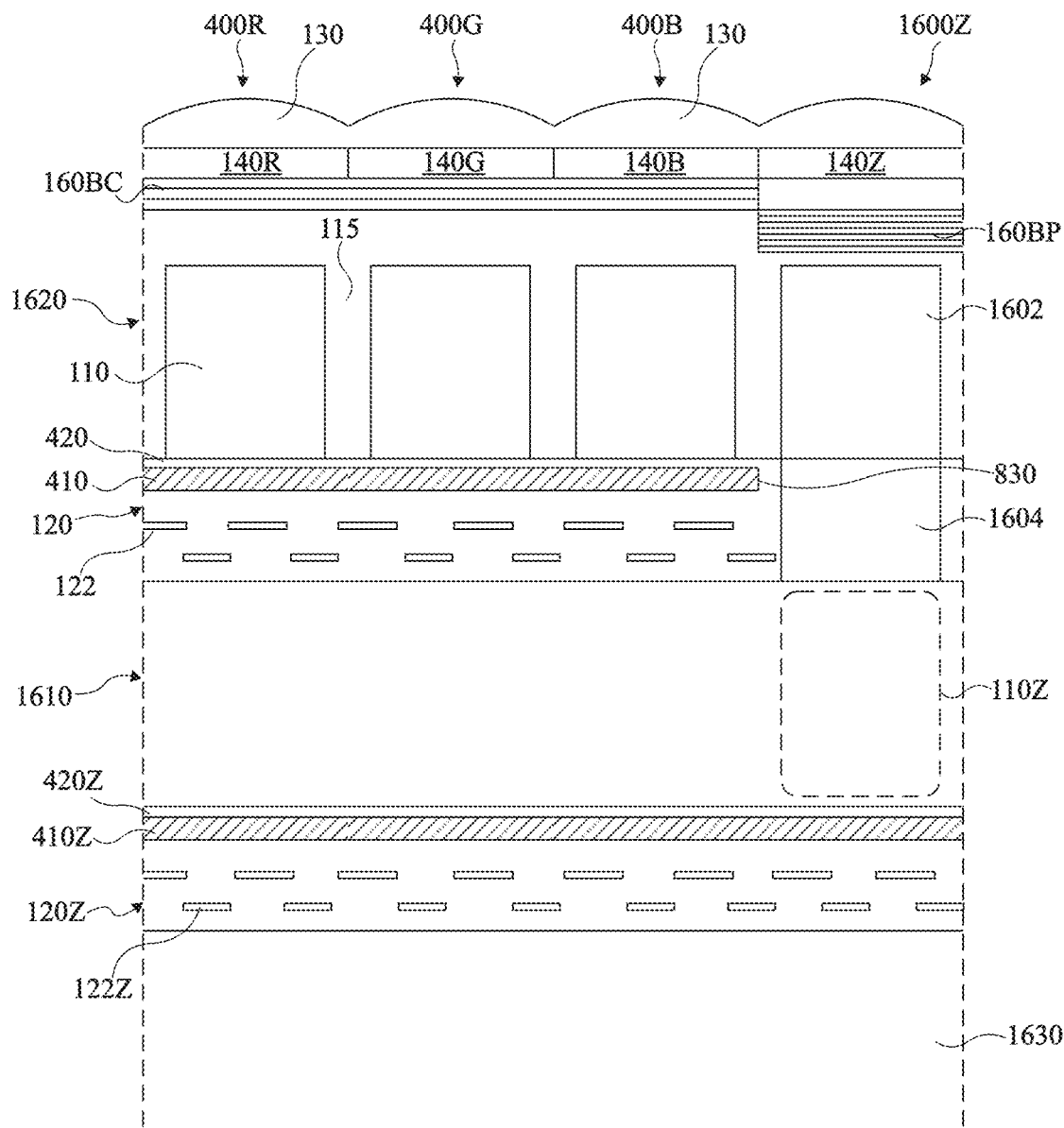
FIG. 17 is a cross-section view partially and schematically showing another embodiment of an image sensor.

FIG. 17 is a cross-section view partially and schematically showing an embodiment of an image sensor 1600. Image sensor 1600 comprises elements identical or similar to those of sensor 1400 of FIG. 14, arranged identically or similarly, with the difference that pixel 400Z is replaced with a pixel 1600Z.

Pixel 1600Z comprises elements identical or similar to those of pixel 400Z of FIG. 14, arranged identically or similarly, that is, a photodetection region 110Z, and layers 420Z, 410Z, and 120Z respectively identical or similar to photodetection region 110 and layers 420, 410, and 120 of pixel 400Z of FIG. 4. In pixel 1600Z, semiconductor photodetection region 110Z is located at a level lower than that of photodetection regions 110 of pixels 400R, 400G, and 400B. Pixel 1600Z further comprises optical transmission regions 1602 and 1604 located between its photodetection region 110Z and its filter 160BP.

Region 1602 is located at the same level as regions 110 of pixels 140R, 140G, and 140B, and region 1604 extends vertically between region 110Z and optical transmission region 1602. Region 110Z of pixel 1600Z is located in a substrate 1610 which extends horizontally under layer 120 common to pixels 400R, 400G, and 400B. Layers 420Z, 410Z and 120Z extend horizontally on the lower surface of substrate 1610.

Components such as transistors, not shown, are formed on the lower surface, or front side, of substrate 1610. Such transistors are for example interconnected by tracks forming metal regions 122Z located in layer 120Z. Transmission region 1602 is preferably made of the same semiconductor as regions 110 of pixels 400R, 400G, 400B. Region 1604 is preferably made of a dielectric, for example, made of silicon nitride, or of amorphous silicon, and extends from the lower surface of region 1602, through layers 420, 410, and 120.

In operation, the optical radiations transmitted by filter 160BP are guided by optical regions 1602 and 1604 all the way to photodetection region 110Z.

The sensor may have densities of transistors and of metal interconnects formed by regions 122 and 122Z between the transistors greater than the densities of transistors and of interconnections in a sensor comprising no substrate 1610 extending under pixels 400R, 400G, and 400B. Sensor 1600 may thus be particularly compact.

To form sensor 1600, regions 110 and trenches 115 separating regions 110 are formed in a semiconductor substrate 1620, for example, made of silicon. Optional components such as transistors, optional insulating layer 420, absorbing layer 410, insulating layers 120 containing metal regions 122, and region 1604, are then formed on the front side of substrate 1620.

Optional components such as transistors, optional insulating layer 420Z, absorbing layer 410Z, and the insulating layers 120Z containing metal regions 122Z, are separately formed on the front side of substrate 1610 (lower surface) comprising regions 110Z.

A handle 1630, for example, a semiconductor substrate, is bonded to the front side of insulating layer 120Z. The portions of substrate 1610 located on the back side are then removed down to the upper level of regions 110Z, for example, by chem.-mech. polishing.

The back side of substrate 1610 is then bonded to the front side of layer 120 and of region 1604.

All the elements are then removed from the back side of substrate 1620 down to a level defining the upper level of regions 110 of pixels 400R, 400B, and 400Z, for example, by polishing.

Filters 160BC, 160BP, 140R, 140G, 140B, optional filter 140Z and the possible lenses 130 are then formed, in the same way as that described in relation with FIG. 14 to form these elements.

Various embodiments and variations have been described. It will be understood by those skilled in the art that certain features of these various embodiments and variations may be combined, and other variations will occur to those skilled in the art. In particular, the variations and embodiments described in relation with FIGS. 8 to 13 are compatible with one another and may be applied, alone or combined, to the embodiments of FIGS. 14 to 17.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising a plurality of pixels, each comprising:
   a semiconductor photodetection region;
      a metal region arranged on a first surface of the semiconductor region;
      a band-pass or band elimination interference filter arranged on a second surface of the semiconductor region opposite to the first surface; and
      between the semiconductor region and the metal region, a portion of an absorbing layer made of a material different from that of the semiconductor region, the absorbing layer being capable of absorbing, in a single passage, more than 30% of an incident radiation at the central wavelength of the passband or of the stop band of the interference filter.

2. The image sensor of claim 1, wherein, in each pixel, the semiconductor layer is made of silicon.

3. The image sensor of claim 1, wherein, in each pixel, the absorbing layer comprises germanium or carbon.

4. The image sensor of claim 1, wherein, in each pixel, said absorbing layer portion is doped.

5. The image sensor of claim 1, wherein, in each pixel, the absorbing layer is amorphous.

6. The image sensor of claim 1, wherein, in each pixel, the absorbing layer is conductive and coupled to a node of application of a bias voltage.

7. The image sensor of claim 1, wherein the absorbing layer portion has a network pattern of absorbing elements and/or of openings.

8. The image sensor of claim 1, wherein each pixel comprises a portion of a dielectric layer located against the absorbing layer on the side of the semiconductor region.

9. The image sensor of claim 1, wherein, in each pixel, the interference filter comprises a repetition of alternated layers having different optical indexes.

10. The image sensor of claim 1, wherein, in each pixel, the central wavelength is in a wavelength range from 700 nm to 1,100 nm.

11. The image sensor of claim 1, wherein each pixel comprises an additional colored or infrared filter covering the first surface of the semiconductor region.

\* \* \* \* \*